(12) United States Patent
Tamaki

(10) Patent No.: US 7,518,167 B2
(45) Date of Patent: Apr. 14, 2009

(54) SEMICONDUCTOR DEVICE

(75) Inventor: Tokuhiko Tamaki, Osaka (JP)

(73) Assignee: Panasonic Corporation, Osaka (JP)

( * ) Notice: Subject to any disclaimer, the term of this patent is extended or adjusted under 35 U.S.C. 154(b) by 136 days.

(21) Appl. No.: 11/033,729

(22) Filed: Jan. 13, 2005

(65) Prior Publication Data

US 2005/0285205 A1    Dec. 29, 2005

(30) Foreign Application Priority Data

Jun. 23, 2004    (JP)    ............... 2004-184806

(51) Int. Cl.
*H01L 29/41*    (2006.01)
(52) U.S. Cl. .............. 257/204; 257/E27.062; 438/927
(58) Field of Classification Search ........ 257/204, 257/E27.062; 438/927
See application file for complete search history.

(56) References Cited

U.S. PATENT DOCUMENTS

| 6,127,214 | A | * | 10/2000 | Niuya | 438/224 |
| 6,160,282 | A | * | 12/2000 | Merrill | 257/292 |
| 6,252,427 | B1 | * | 6/2001 | Domae et al. | 326/121 |
| 2003/0203611 | A1 | * | 10/2003 | Yamamoto | 438/592 |
| 2004/0038466 | A1 | * | 2/2004 | Yen et al. | 438/197 |

FOREIGN PATENT DOCUMENTS

| JP | 65-086875 | 5/1980 |
| JP | 2001-077210 A | 3/2001 |

OTHER PUBLICATIONS

English Translation OF Sugawara 55-068675.*
Japanese Office Action dated May 15, 2007 (with English Translation).

* cited by examiner

*Primary Examiner*—Bradley K Smith
*Assistant Examiner*—Amar Movva
(74) *Attorney, Agent, or Firm*—McDermott Will & Emery LLP

(57) ABSTRACT

A semiconductor device includes: a p-type MIS transistor having a first gate electrode including silicon doped with p-type impurities; an n-type MIS transistor having a second gate electrode including silicon doped with n-type impurities; and a shared line which connects the p-type MIS transistor and the n-type MIS transistor and serves as a path of a power supply current or a ground current, the shared line including silicided silicon. The first gate electrode and the second gate electrode have silicided top portions, respectively, to establish electrical connection therebetween and the shared line has a line width larger than the line widths of the first gate electrode and the second gate electrode.

24 Claims, 5 Drawing Sheets

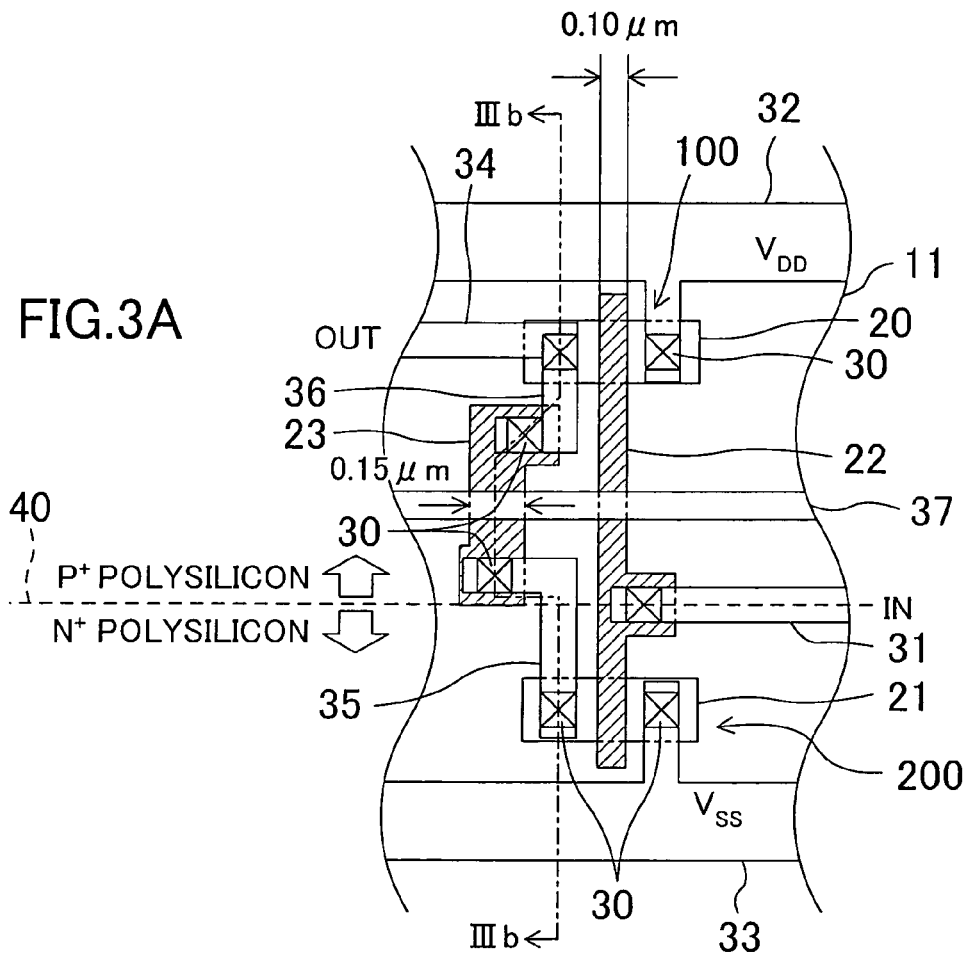
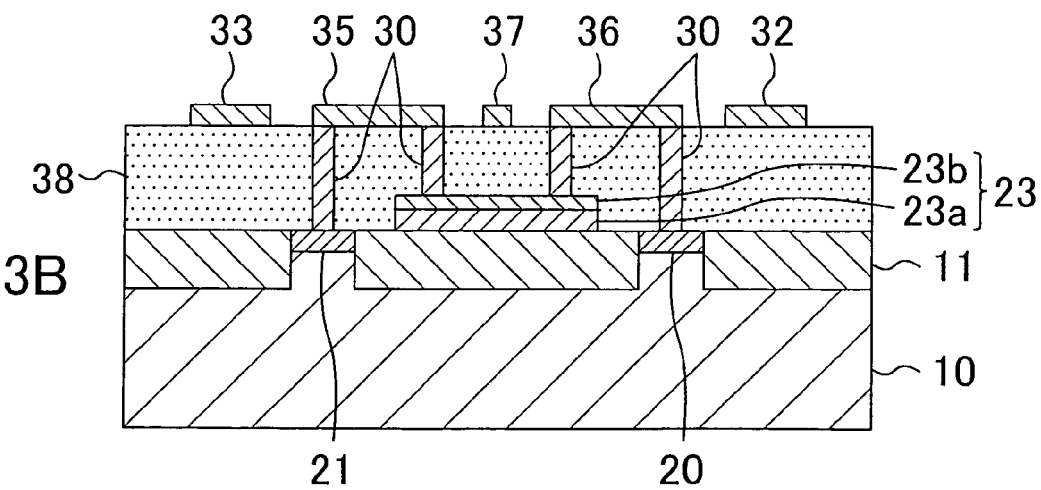

SEMICONDUCTOR DEVICE

CROSS-REFERENCE TO RELATED APPLICATION

This non-provisional application claims priority under 35 U.S.C. §119(a) on patent application Ser. No. 2004-184806 filed in Japan on Jun. 23, 2004, the entire contents of which are hereby incorporated by reference.

BACKGROUND OF THE INVENTION (a) Field of the Invention

The present invention relates to a semiconductor device, particularly to a MIS semiconductor device including a silicided dual-gate electrode.

(b) Description of Related Art

As widely known in the art, with the decrease in power supply voltage in CMOS devices and the following improvement in threshold voltage accuracy in NMOS transistors and PMOS transistors, dual-gate structures are becoming dominant techniques. More specifically, is used a gate electrode made of polysilicon, part of which is doped with n-type impurities for an NMOS transistor and the other part of which is doped with p-type impurities for a PMOS transistor. In such a dual-gate structure, a pn junction is generated if a single polysilicon feature is used as the gate electrode for the NMOS transistor and the PMOS transistor. Accordingly, a silicided gate electrode formed by siliciding a top portion of the polysilicon feature having the pn junction is often used in combination with the dual-gate structure.

In the silicided portion of the polysilicon dual-gate electrode, agglomeration of silicide occurs to cause a physical break with a certain probability. To prevent the break in the silicided portion, several processes have been proposed. Nowadays, however, as chips are integrated higher and higher and the line width of the gate electrode (gate length) is reduced to 0.1 μm or less, the degree of technical difficulty in preventing the break in the silicided portion is extremely high.

Except the case where the break in the silicided portion occurs on the pn junction or polysilicon having low impurity concentration and high resistance, the break in the silicided portion does not directly lead to an electrical break because conductive polysilicon lies immediately below the silicided portion. However, even if the silicided portion is not completely broken, reduction in thickness of the silicided portion increases the resistance, thereby causing a problem of delay in circuit operation.

SUMMARY OF THE INVENTION

In view of the above-described conventional problems, an object of the present invention is to prevent an increase in circuit delay caused by the break in the silicided portion of the dual-gate electrode in the dual-gate MIS transistor, thereby preventing a malfunction of the circuit.

The inventor of the present invention has gained the following findings as result of various researches on a silicide line in the dual-gate MIS transistor.

First, the inventor of the present invention noticed that the silicide line usually has a sheet resistance as very low as 5 $\Omega/\square$ even if the width thereof is 0.1 μm, but the increase in resistance resulted from the break in the silicided portion caused by the silicide agglomeration is comparable to the insertion of a series resistance of 1 kΩ or higher.

FIG. 1 shows the quantification results of the influence of the resistance increase on the circuit delay. For the quantification of FIG. 1, used was an inverter including a p-type MOS transistor, an n-type MOS transistor and a dual-gate electrode of 0.1 μm line width (gate length) which is made of polysilicon and has a silicided top portion. Drains of the inverter are electrically connected to each other via a shared line of 0.1 μm width which is made of polysilicon and has a silicided top portion.

A simulation of the circuit delay was performed using the thus formed 125 inverters connected in series.

FIG. 1 shows the results of the simulation, i.e., the dependence of the rate of increase in delay time on parasitic resistance when the resistance increases due to the break in the silicided portion. In FIG. 1, graphs A and B represent the dual-gate electrode and the shared line, respectively. As shown in FIG. 1, graph A representing the dual-gate electrode through which a current flows with charge/discharge in the inverter shows the rate of increase in delay time as low as 4% when the resistance increases by 5 kΩ. On the other hand, graph B representing the shared line, which is a current path from a power supply voltage $V_{DD}$ to a ground voltage $V_{SS}$ where a drop in voltage occurs on application of an ON current, shows the rate of increase in delay time as high as 28% when the resistance increases by 5 kΩ.

Thus, the inventor of the present invention has found that, for the purpose of preventing the circuit delay caused by the break in the silicided portion, it is significantly effective to avoid the break in the silicided portion in the current path from the power supply voltage to the ground voltage where the voltage drop occurs.

Further, the inventor of the present invention has confirmed that a thin silicide line, which is not yet broken in the initial state after the manufacture thereof and does not have high resistance, is led to the break through the application of a current.

FIG. 2 shows the dependence of the frequency of occurrence of the break in a thin, silicided p-type polysilicon line which increases the resistance through the continuous application of a direct current of 1 mA for 48 hours on width of the thin line. As shown in FIG. 2, a thin silicide line of 0.1 μm line width causes the break at a frequency of 5 spots/m, whereas a thin silicide line of 0.15 μm line width shows the frequency less than the detection limit. Though not shown, the frequency of occurrence of the break in a thin, silicided n-type polysilicon line is less than the detection limit even if the line width thereof is 0.1 μm.

According to the above findings, it is concluded that the malfunction due to the circuit delay caused by the break in the silicided portion of the thin, silicided polysilicon line (thin silicide line) during the operation of the circuit is effectively prevented by setting the line width of the thin silicide line which serves as the current path from the power supply voltage to the ground voltage where the voltage drop occurs to a such value that prevents the break in the silicided portion, irrespective of the gate length of the transistor.

The present invention has been achieved based on these findings. More specifically, the invention is realized by the following configuration.

A semiconductor device according to the present invention comprises: a p-type MIS transistor having a first gate electrode including silicon doped with p-type impurities; an n-type MIS transistor having a second gate electrode including silicon doped with n-type impurities; and a shared line which connects the p-type MIS transistor and the n-type MIS transistor and serves as a path of a power supply current or a ground current, the shared line including silicided silicon, wherein the first gate electrode and the second gate electrode have silicided top portions, respectively, to establish electrical connection therebetween and the shared line has a line width larger than the line widths of the first gate electrode and the second gate electrode.

Since the line width of the silicided gate electrode is a gate length regarded as a parameter of device characteristics, the line width cannot be changed easily. Based on the above findings, the rate of increase in delay time does not significantly vary even if the break occurs in the silicided portion of the silicided gate electrode to increase the parasitic resistance. On the other hand, the rate of increase in delay time becomes remarkably high if the break occurs in the silicided portion of the shared line which connects the p-and n-type MIS transistors and serves as the path of the power supply current or the ground current and the parasitic resistance increases.

According to the semiconductor device of the present invention, the line width of the shared line serving as the path of the power supply current or the ground current and including silicided silicon is set larger than the line widths of the silicided first and second gate electrodes, and whereby the silicided portion of the shared line is less likely to cause the break. Therefore, the increase in delay time is prevented in the semiconductor device including the silicided shared line which connects the p-and n-type MIS transistors and serves as the path of the power supply current or the ground current. As a result, a malfunction of the semiconductor device is prevented.

In the semiconductor device of the present invention, the shared line preferably includes p-type polysilicon doped with p-type impurities or undoped polysilicon. When the shared line is made of p-type polysilicon, the increase in delay time is more effectively prevented by setting the line width of the shared line larger than the line width of the gate electrode. In general, the impurities doped in the gate electrode of the n-type MIS transistor are arsenic or phosphorus and the impurities doped in the gate electrode of the p-type MIS transistor are boron. However, since boron is diffused in a gate oxide film, it is necessary to reduce the boron concentration as compared with the concentration of arsenic or phosphorus to stabilize the characteristics of the p-type MIS transistor. Therefore, once the break occurs in the silicided portion, the parasitic resistance at the break in the silicided portion becomes higher in the p-type polysilicon gate electrode than in the n-type polysilicon gate electrode. Though the reason is unclear, the inventor of the present invention has found that the silicided portion of the p-type polysilicon gate electrode doped with boron has higher probability of occurrence of the break than the silicided portion of the n-type polysilicon gate electrode doped with arsenic or phosphorus. Therefore, if the p-type polysilicon doped with the p-type impurities or undoped polysilicon is used as the shared line, the increase in delay time is more effectively prevented by setting the line width of the shared line larger than the line widths of the gate electrodes.

In the semiconductor device according to the present invention, it is preferable that the shared line includes a p-type region made of p-type polysilicon doped with p-type impurities and an n-type region made of n-type polysilicon doped with n-type impurities. Further, the p-type region preferably has a line width larger than the line widths of the first gate electrode and the second gate electrode. If the shared line is divided into the p-type region and the n-type region in this way, the line width of the p-type region where a large parasitic resistance occurs is set larger than the line widths of the gate electrodes, thereby enhancing the effect of preventing the increase in delay time.

In the semiconductor device according to the present invention, it is preferable that the first gate electrode and the second gate electrode are formed on a semiconductor substrate, the shared line is formed on a region of the semiconductor substrate located to one side of the first gate electrode and the second gate electrode and a line is formed on the shared line via an insulating film interposed therebetween. In so doing, the shared line including silicided silicon and the first and second gate electrodes both including silicided silicon are formed in the same step. Moreover, since the gate electrodes are formed on the semiconductor substrate and so is the shared line, no obstacle is presented to the line formed on the shared line and the gate electrodes via the insulating film interposed therebetween.

In the semiconductor device according to the present invention, it is preferable that a source of the p-type transistor is connected to a power supply line, a source of the n-type transistor is connected to a ground line and the shared line is connected to a drain of the p-type transistor and a drain of the n-type transistor, thereby forming an inverter circuit by the p-type transistor and the n-type transistor.

In the semiconductor device according to the present invention, the line widths of the first gate electrode and the second gate electrode are less than 0.15 µm, respectively, and the line width of the shared line is not less than 0.15 µm.

In the semiconductor device according to the present invention, the line width of the shared line is 1.2 times or more as large as the line widths of the first gate electrode and the second gate electrode.

BRIEF DESCRIPTION OF THE DRAWINGS

FIG. 3A is a plan view illustrating a semiconductor device according to a first embodiment of the present invention and FIG. 3B is a sectional view cut along the line IIIb—IIIb shown in FIG. 3A.

Figure 1:
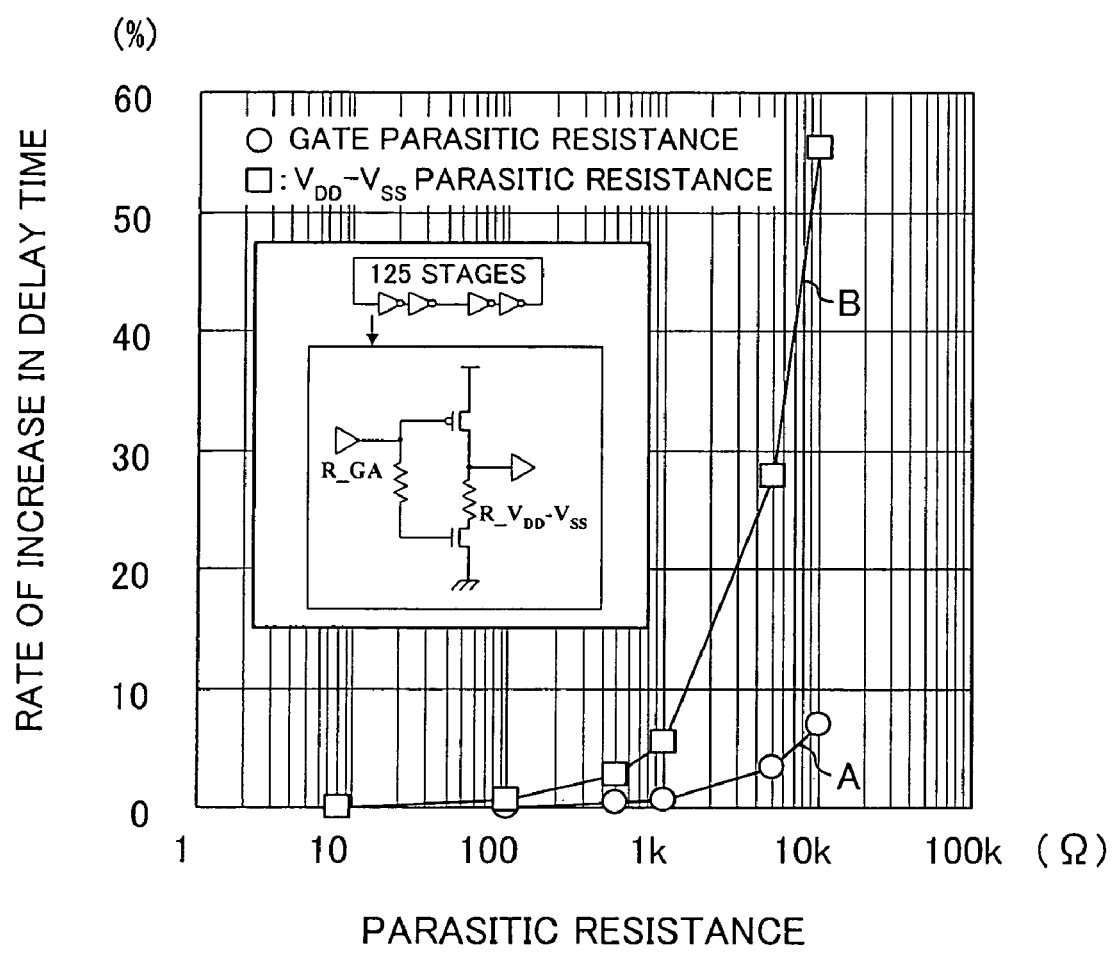
FIG. 1 is a graph based on the findings of the present invention, illustrating a comparison between a dual-gate electrode and a shared line connecting drains in respect of the dependence of the rate of increase in delay time on parasitic resistance when a resistance increases due to a break in a silicided portion.
Figure 2:
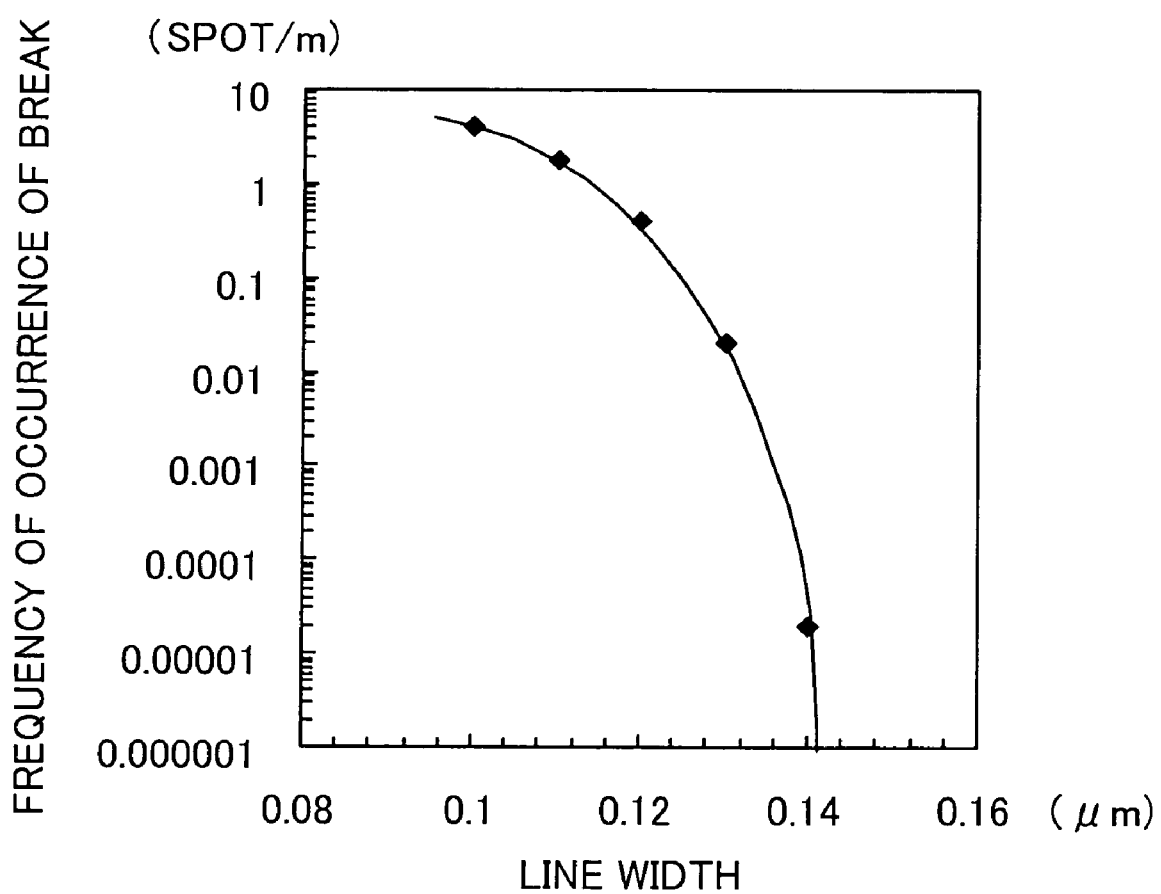
FIG. 2 is a graph based on other findings of the present invention, illustrating the dependence of the frequency of occurrence of a break in a thin, silicided p-type polysilicon line which increases a resistance through the continuous application of a direct current of 1 mA for 48 hours on width of the thin line.

DETAILED DESCRIPTION OF THE INVENTION (First Embodiment)

Referring to the drawings, an explanation is given of a first embodiment according to the present invention.

FIG. 3A is a plan view illustrating a semiconductor device according to a first embodiment of the present invention and FIG. 3B is a sectional view cut along the line IIIb—IIIb shown in FIG. 3A.

As shown in FIG. 3A and FIG. 3B, a p-type diffusion region 20 and an n-type diffusion region 21 are formed at the top of a semiconductor substrate 10 made of silicon (Si), for example. The p-and n-type diffusion regions 20 and 21 are divided by isolation regions 11 to be spaced from each other.

On the isolation regions 11 surrounding the p-type diffusion region 20 and the n-type diffusion region 21, a line-shaped gate electrode 22 made of polysilicon having a silicided top portion is formed. Thus, a p-type MOS transistor 100 is made up of the p-type diffusion region 20 and the gate electrode 22 and an n-type MOS transistor 200 is made up of the n-type diffusion region 21 and the gate electrode 22.

The gate electrode 22 has a line width (gate length) of 0.10 μm. A lower portion thereof is made of polysilicon and an upper portion is silicided with, for example, cobalt (Co), nickel (Ni), chromium (Cr), tungsten (W), titanium (Ti) or molybdenum (Mo). Further, part of the lower polysilicon portion of the gate electrode 22 nearer the p-type MOS transistor 100 in relation to a boundary 40 shown in FIG. 3A is a p-type. gate electrode doped with boron (B) as p-type impurities at a concentration of $1 \times 10^{19}$ atom/cm$^3$, and the other part of the lower polysilicon portion of the gate electrode 22 nearer the n-type MOS transistor 200 in relation to the boundary 40 is an n-type gate electrode doped with phosphorus (P) or arsenic (As) as n-type impurities at a concentration of $1 \times 10^{20}$ atom/cm$^3$. That is, the gate electrode 22 has a so-called dual-gate structure.

A pn junction in the gate electrode 22 is connected to an input signal line 31 formed on an interlayer insulating film 38 via a contact plug 30.

A source of the p-type diffusion region 20 in the p-type MOS transistor 100 is connected via a contact plug 30 to a power supply line 32 made of metal such as aluminum (Al) or copper (Cu) formed on the interlayer insulating film 38. Further, a source of the n-type diffusion region 21 in the n-type MOS transistor 200 is connected via a contact plug 30 to a ground line 33 made of metal formed on the interlayer insulating film 38.

A drain of the p-type diffusion region 20 in the p-type MOS transistor 100 is connected via contact plugs 30 to an output signal line 34 formed on the interlayer insulating film 38.

The drain in the p-type MOS transistor 100 is electrically connected to a drain in the n-type MOS transistor 200 via a first shared line 35, a second shared line 23 and a third shared line 36. Thus, the p-and n-type MOS transistors 100 and 200 provide an inverter circuit using the gate electrode 22 as an input terminal and the drain as an output terminal.

The second shared line 23 is formed on the isolation region 11 in the semiconductor substrate 10 in parallel to the gate electrode 22 and has a line width of 0.15 μm and the same structure as the gate electrode 22. More specifically, as shown in FIG. 3A, the second shared line 23 is situated nearer the p-type MOS transistor 100 in relation to the boundary 40. Therefore, as shown in FIG. 3B, a lower portion 23a of the second shared line 23 is made of p-type polysilicon and an upper portion 23b of the second shared line 23 is made of metal silicide.

The first shared line 35 is made of metal and formed on the interlayer insulating film 38. The first shared line 35 connects the drain of the n-type diffusion region 21 in the n-type MOS transistor 200 to the second shared line 23 via the contact plugs 30 formed at the ends of the first shared line 35.

Further, the third shared line 36 is made of a metal line formed on the interlayer insulating film 38. The third shared line 36 connects the drain of the p-type diffusion region in the p-type MOS transistor 100 to the second shared line 23 via the contact plugs 30 formed at the ends of the third shared line 36.

In the first embodiment, the power supply line 32 and the ground line 33 are arranged in parallel to each other in the gate length direction of the gate electrode 22. Further, a signal line 37 made of metal is formed on the interlayer insulating film 38 between the power supply line 32 and the ground line 33 so as to extend in the direction crossing the gate electrode 22. Accordingly, the second shared line 23 is formed on the same level as the gate electrode 22 (on the substrate) so that the signal line 37 formed on the interlayer insulating film 38 does not intersect with the shared lines 35 and 36 connecting the drains of the p-and n-type MOS transistors 100 and 200 on the same level (on the interlayer insulating film 38). Therefore, the second shared line 23 and the gate electrode 22 are formed in the same step.

As described above, according to the first embodiment, the second shared line 23 having the same structure as the p-type portion of the gate electrode 22 has a line width of 0.15 μm which is larger than the line width of the p-type portion of the gate electrode 22. Since the second shared line 23 is formed in a current path from a power supply potential $V_{DD}$ to a ground potential $V_{SS}$, a drop in voltage occurs when a resistance is generated in the line on application of an ON current.

As described above, the break in the silicided portion derived from the current application occurs at a frequency of several spots/m on the polysilicon line of 0.1 μm width. However, the frequency of occurrence of the break on the polysilicon line of 0.15 μm width is controlled less than the detection limit. Since the second shared line 23 which has the same structure as the gate electrode 22 and is formed in the current path from the power supply potential $V_{DD}$ to the ground potential $V_{SS}$ has a line width larger than that of the dual-gate electrode, the break in the silicided portion which occurs during the operation of the inverter circuit is prevented, and whereby a malfunction due to the circuit delay is avoided.

The second shared line 23 preferably has a line width not less than 0.15 μm. Further, the line width of the shared line 23 may be 1.2 times or more as large as the line width of the gate electrode 22.

In the first embodiment, p-type polysilicon is used as a material for the second shared line 23, but undoped polysilicon may also be used.

It is needless to say that the layout of the second shared line 23 explained in the first embodiment is an example and the present invention is not limited thereto.

(Second Embodiment)

Hereinafter, an explanation is given of a second embodiment of the present invention with reference to the drawings.

Figure 4:
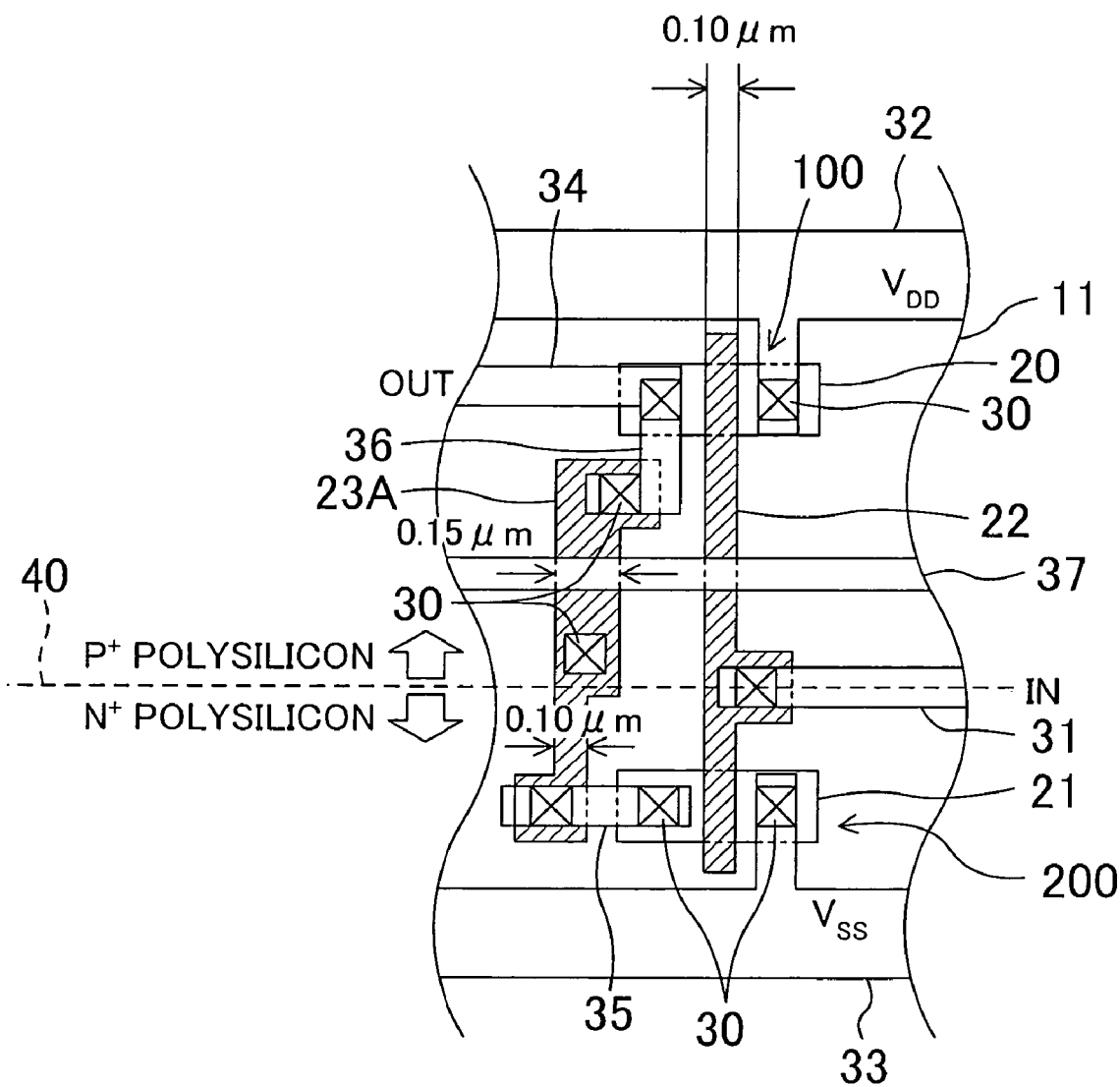
FIG. 4 is a plan view illustrating a semiconductor device according to a second embodiment of the present invention.

FIG. 4 shows a planar configuration of a semiconductor device according to the second embodiment of the present invention. In FIG. 4, the same components as those shown in FIG. 3A are given with the same reference numerals and explanations thereof are omitted.

An explanation is given only of the differences from the semiconductor device of the first embodiment. As shown in FIG. 4, a second shared line 23A is formed not only in a region nearer the p-type MOS transistor 100 in relation to the boundary 40 but also in a region nearer the n-type MOS transistor 200 in relation to the boundary 40, i.e., the second shared line 23A is formed to cross the boundary 40. Therefore, in the second shared line 23A, part of a lower portion thereof nearer the p-type MOS transistor 100 in relation to the boundary 40 is made of p-type polysilicon and the other part of the lower portion nearer the n-type MOS transistor 200 in relation to the boundary 40 is made of n-type polysilicon.

As described above, the break in the silicided portion, which generally occurs in silicided p-type polysilicon on application of a current, does not occur very frequently in silicided n-type polysilicon. Accordingly, in the second embodiment, the line width of the n-type polysilicon region of the second shared line 23A is set to 0.1 μm which is the same as the line width (gate length) of the gate electrode 22 and the line width of the p-type polysilicon region of the second shared line 23A is set to 0.15 μm which is larger than the line width of the gate electrode 22.

According to the second embodiment, the second shared line 23A having the same structure as the gate electrode 22 includes the p-type region of 0.15 μm line width which is larger than the p-type portion of the gate electrode 22. This prevents the break in the silicided portion which occurs during the operation of the inverter circuit, thereby avoiding the malfunction due to the circuit delay.

The n-type region of the second shared line 23A is not necessarily required to have a smaller line width than the p-type region. As described above, the n-type region is less likely to cause the increase in delay time due to an increase in parasitic resistance than the p-type region. Therefore, if the line width of the n-type region of the second shared line 23A is set smaller than the line width of the p-type region as in the second embodiment, an increase in layout area is restricted to the minimum.

When a thin line made of silicided p-type polysilicon is used in the current path from the power supply potential to the ground potential in a SRAM (static random access memory) cell having a relatively small gate width, which is a length between the diffusion regions in a transistor, and the silicided portion is broken, the break does not cause a significant influence on the circuit delay because an ON resistance of the transistor in the SRAM cell is inherently high.

Figure 5:
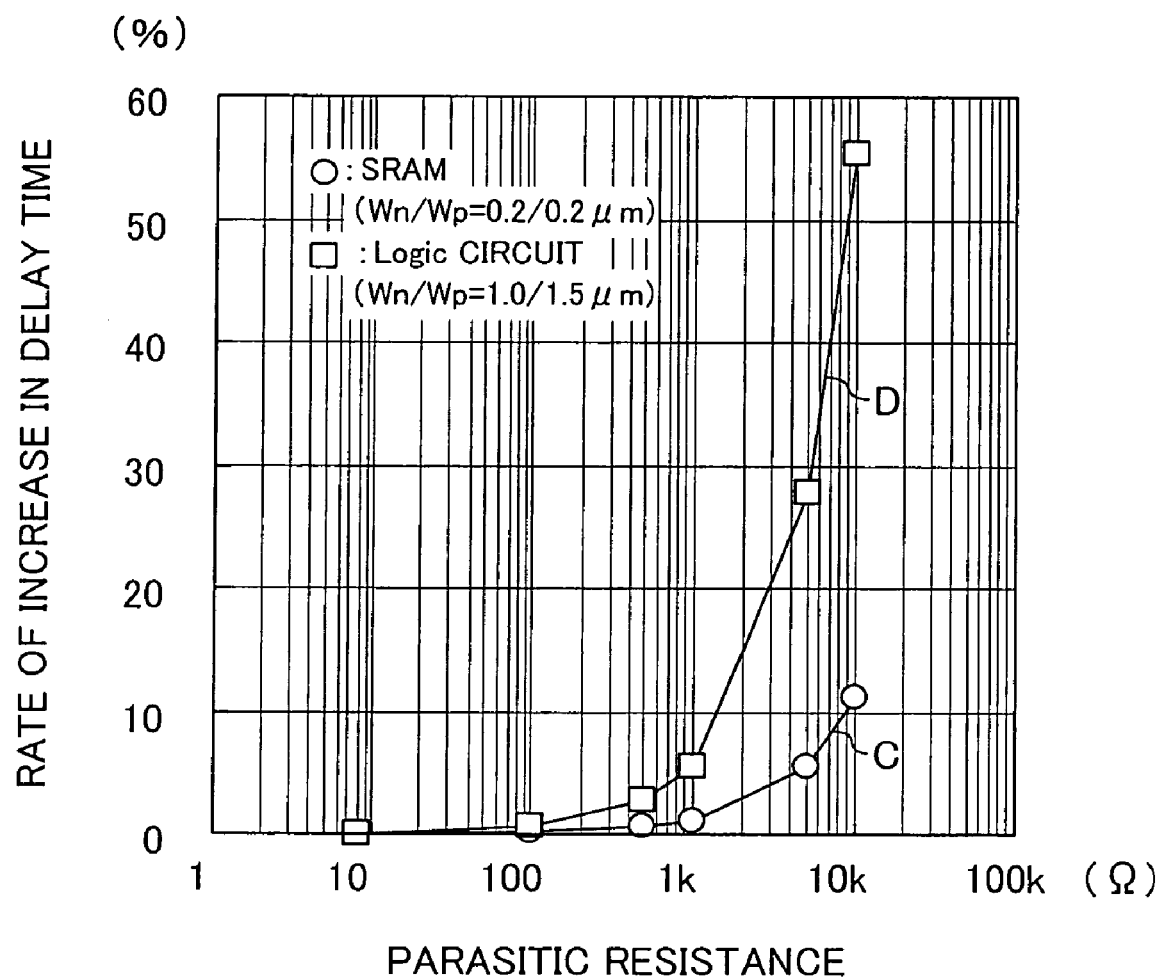
FIG. 5 is a graph based on a feature of the present invention, illustrating a comparison between an inverter circuit in a SRAM cell and an inverter circuit in a logic circuit in respect of the dependence of the rate of increase in delay time on parasitic resistance when a resistance increases due to a break in a silicided portion of a polysilicon line formed in a current path from a power supply potential to a ground potential.

FIG. 5 illustrates the results of a simulation, i.e., the dependence of the rate of increase in delay time on parasitic resistance when the resistance increases due to the break in the silicided portion of the polysilicon line formed in the current path from the power supply potential to the ground potential. Referring to FIG. 5, graph C represents an inverter circuit (flip-flop circuit) in the SRAM cell and graph D represents an inverter circuit in a logic circuit. The flip-flop circuit in the SRAM cell includes n- and p-type transistors both having a gate width of 0.2 μm. On the other hand, the inverter circuit in the logic circuit includes an n-type transistor having a gate width of 1.0 μm and a p-type transistor having a gate width of 1.5 μm. As shown in FIG. 5, graph C representing the inverter circuit in the SRAM cell shows the rate of increase in delay time as low as 6% when the resistance increases by 5 kΩ. Further, since the current passing through the SRAM is very low, the resistance increase does not occur in the inverter circuit. Moreover, the SRAM cell can be relieved by a redundancy circuit technique. On the other hand, graph D representing the inverter circuit in the logic circuit shows the rate of increase in delay time as high as 28% when the resistance increases by 5 kΩ.

Therefore, it is considered that the present invention is more suitably applied to the inverter circuit in the logic circuit having a low ON resistance than the inverter circuit in the SRAM cell.

As explained above, the semiconductor device according to the present invention is less likely to cause the break in the silicided portion of the shared line including silicided silicon and serving as the path of the power supply current or the ground current, thereby preventing the increase in delay time and avoiding the malfunction of the semiconductor device.

Thus, the present invention is effectively applied to MIS semiconductor devices having silicided dual-gate electrodes.

What is claimed is:

1. A semiconductor device comprising:
   a p-type MIS transistor having a first gate electrode including silicon doped with p-type impurities;
   an n-type MIS transistor having a second gate electrode including silicon doped with n-type impurities; and
   a first shared line made of metal, a second shared line made of silicon of which a top portion is silicided, and a third shared line made of metal, each line connecting the p-type MIS transistor and the n-type MIS transistor and serving as a path of a power supply current or a ground current, wherein
   the first gate electrode and the second gate electrode have silicided top portions, respectively, to establish electrical connection therebetween,
   the second shared line is formed only on an isolation region provided in a semiconductor substrate, and is connected to the first and third shared lines formed on an interlayer insulating film, respectively via a contact plug,
   the silicon, positioning at a lower doped portion of the second shared line, has a p-type region made of p-type polysilicon doped at least with p-type impurities, and
   the p-type region of the second shared line has a line width larger than the line widths of the first gate electrode and the second gate electrode.

2. A semiconductor device according to claim 1, wherein the lower portion of the second shared line includes only the p-type region.

3. A semiconductor device according to claim 1, wherein the lower portion of the second shared line includes the p-type region and an n-type region made of n-type polysilicon doped with n-type impurities.

4. A semiconductor device according to claim 1, wherein the first gate electrode and the second gate electrode are formed on a semiconductor substrate,
   the second shared line is formed on the isolation region and parallel to the first gate electrode and the second gate electrode.

5. A semiconductor device according to claim 1, wherein a source of the p-type MIS transistor is connected to a power supply line, a source of the n-type MIS transistor is connected to a ground line, and the first to third shared lines are connected to a drain of the p-type MIS transistor and a drain of the n-type MIS transistor, thereby forming an inverter circuit by the p-type MIS transistor and the n-type MIS transistor.

6. A semiconductor device according to claim 1, wherein the line widths of the first gate electrode and the second gate electrode are less than 0.15 μm and the line width of the second shared line is not less than 0.15 μm.

7. A semiconductor device according to claim 1, wherein the line width of the p-type region of the second shared line is 1.2 times or more as large as the line widths of the first gate electrode and the second gate electrode.

8. A semiconductor device according to claim 1, wherein the first gate electrode and the second gate electrode are integrally formed.

9. A semiconductor device according to claim 1, wherein the first gate electrode and the second gate electrode have a dual-gate structure.

10. A semiconductor device according to claim 1, wherein the p-type impurities are boron.

11. A semiconductor device according to claim 1, wherein the n-type impurities are phosphorus or arsenic.

12. A semiconductor device according to claim 1, wherein the first gate electrode and the second gate electrode have bottom portions made of polysilicon and the top portions silicided with chromium, tungsten, titanium or molybdenum.

13. A semiconductor device according to claim 1, wherein the first gate electrode and the second gate electrode have bottom portions made of polysilicon and the top portions silicided with cobalt.

14. A semiconductor device according to claim 1, wherein
a p-type diffusion region and an n-type diffusion region are formed in a top portion of a semiconductor substrate and divided by isolation regions to be spaced from each other,
the p-type diffusion region and the first gate electrode form the p-type MIS transistor, and
the n-type diffusion region and the second gate electrode form the n-type MIS transistor.

15. A semiconductor device according to claim 1, wherein a pn junction in the first gate electrode and the second gate electrode is connected to an input signal line formed on the interlayer insulating film via a contact plug.

16. A semiconductor device according to claim 1, wherein
a source of the p-type MIS transistor is connected to a power supply line formed on the interlayer insulating film via a contact plug, and
a source of the n-type MIS transistor is connected to a ground line formed on the interlayer insulating film via a contact plug.

17. A semiconductor device according to claim 1, wherein a drain of the p-type MIS transistor and a drain of the n-type MIS transistor are electrically connected to each other via the first to third shared lines.

18. A semiconductor device according to claim 1, wherein
the second shared line is formed on the isolation region and is apart from the first gate electrode in a gate length direction.

19. A semiconductor device according to claim 1, wherein the second shared line has a same structure as that of the first gate electrode.

20. A semiconductor device according to claim 1, wherein a lower portion of the second shared line is made of polysilicon and an upper portion of the second shared line is made of metal silicide.

21. A semiconductor device according to claim 1, wherein a width of the second shared line in a gate width direction is smaller than that of the first gate electrode.

22. A semiconductor device according to claim 1, further comprising:
the interlayer insulating film formed on the first gate electrode, the second gate electrode and the second shared line; and
a signal line formed on the interlayer insulating film,
wherein the signal line extends in a direction crossing the first gate electrode and the second shared line.

23. A semiconductor device according to claim 1, further comprising:
the interlayer insulating film formed on the first gate electrode, the second gate electrode and the second shared line; and
a power supply line, a ground line and a signal line, each being formed on the interlayer insulating film,
wherein the power supply line and the ground line are arranged in parallel to each other and extend in a gate length direction of the first gate electrode and the second gate electrode, and
the signal line is formed in a region between the power supply line and the ground line and extends in a direction crossing the first gate electrode and the second shared line.

24. A semiconductor device according to claim 1, wherein the p-type MIS transistor and the n-type MIS transistor configure an inverter circuit in a logic circuit.

* * * * *